US012630926B2

(12) United States Patent
Park et al.

(10) Patent No.: US 12,630,926 B2
(45) Date of Patent: May 19, 2026

(54) DEVICE FOR MANUFACTURING A SEMICONDUCTOR DEVICE AND METHOD FOR MANUFACTURING A SEMICONDUCTOR DEVICE USING THE SAME

(71) Applicant: Samsung Electronics Co., Ltd., Suwon-si (KR)

(72) Inventors: Jung Min Park, Seoul (KR); Su Hwan Kim, Seoul (KR); Han Jin Lim, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 639 days.

(21) Appl. No.: 18/060,861

(22) Filed: Dec. 1, 2022

(65) Prior Publication Data
US 2023/0212749 A1     Jul. 6, 2023

(30) Foreign Application Priority Data
Dec. 30, 2021     (KR) ........................ 10-2021-0192926

(51) Int. Cl.
*C23C 16/455*     (2006.01)
*C23C 16/52*     (2006.01)

(52) U.S. Cl.
CPC .. *C23C 16/45578* (2013.01); *C23C 16/45544* (2013.01); *C23C 16/45546* (2013.01); *C23C 16/45574* (2013.01); *C23C 16/52* (2013.01)

(58) Field of Classification Search
None
See application file for complete search history.

(56) References Cited

U.S. PATENT DOCUMENTS

| | | | |
|---|---|---|---|
| 10,837,107 B2 | 11/2020 | Granneman et al. | |
| 2008/0075838 A1* | 3/2008 | Inoue ................ | H01L 21/67109 |
| | | | 118/715 |
| 2011/0186984 A1* | 8/2011 | Saito ................. | C23C 16/45578 |
| | | | 118/715 |
| 2016/0284533 A1* | 9/2016 | Nagano ............. | C23C 16/45578 |

(Continued)

FOREIGN PATENT DOCUMENTS

| | | |
|---|---|---|
| KR | 10-2008-0101494 A | 11/2008 |
| KR | 10-2010-0012115 A | 2/2010 |

(Continued)

*Primary Examiner* — Binu Thomas
(74) *Attorney, Agent, or Firm* — Fish & Richardson P.C.

(57)     ABSTRACT

A device for manufacturing a semiconductor device is provided. The device for manufacturing a semiconductor device includes a tube extending in a first direction, and defining a reaction space therein and configured to accommodate a boat that is configured to receive a plurality of substrates therein, and first and second nozzles each extending in the first direction inside the tube, and being apart from each other on a plane that is perpendicular to the first direction and parallel to upper surfaces of the substrates, wherein the first and second nozzles include a plurality of first injection ports and a plurality of first second injection ports that are configured inject different gases toward a center of the reaction space, respectively, and a plurality of second injection ports are placed in a region between a corresponding pair of adjacent ones of the plurality of first injection ports along the first direction.

12 Claims, 11 Drawing Sheets

(56)                    References Cited

U.S. PATENT DOCUMENTS

| | | | | |
|---|---|---|---|---|
| 2018/0305817 A1 * | 10/2018 | Kogura | ............. | C23C 16/45578 |
| 2020/0340111 A1 * | 10/2020 | Kikuchi | ............ | C23C 16/45578 |
| 2022/0119949 A1 * | 4/2022 | Nagatomi | ......... | C23C 16/45578 |
| 2022/0259738 A1 * | 8/2022 | Ogawa | .............. | C23C 16/45578 |

FOREIGN PATENT DOCUMENTS

| | | | | | |
|---|---|---|---|---|---|
| KR | 10-2011-0077262 | A | | 7/2011 | |
| KR | 10-2011-0111884 | A | | 10/2011 | |
| KR | 10-2012-0012255 | A | | 2/2012 | |
| KR | 10-2012-0066851 | A | | 6/2012 | |
| KR | 101499467 | B1 | | 3/2015 | |
| WO | WO-2021020008 | A1 | * | 2/2021 | ....... C23C 16/45578 |

* cited by examiner

DEVICE FOR MANUFACTURING A SEMICONDUCTOR DEVICE AND METHOD FOR MANUFACTURING A SEMICONDUCTOR DEVICE USING THE SAME

CROSS-REFERENCE TO RELATED APPLICATION(S)

This application claims the benefit of Korean Patent Application No. 10-2021-0192926, filed on Dec. 30, 2021, in the Korean Intellectual Property Office, the disclosure of which is incorporated herein in its entirety by reference.

BACKGROUND

1. Technical Field

The present disclosure relates to devices for manufacturing a semiconductor device and/or methods for manufacturing the semiconductor device using the same.

2. Description of the Related Art

In recent years, as semiconductor devices have become highly integrated, design rules have decreased. Therefore, a region occupied by unit cells in the semiconductor device has decreased, and a line width of the pattern has decreased. Accordingly, a thickness of a thin film has become gradually thinner, and it has been very difficult to form a substrate so as to have a step coverage on the substrate.

On the other hand, an atomic layer deposition (ALD) device that forms a thin film with an atomic layer thickness has been developed. The atomic layer deposition device injects a reaction gas or precursor onto the substrate to grow the thin film. When trying to form different types of thin films using the atomic layer deposition device, it is important to smoothly perform the chemical reaction for forming each thin film.

SUMMARY

Some aspects of the present disclosure provide devices for manufacturing a semiconductor device capable of dividing a reaction space in an atomic layer deposition device to deposit various types of thin films.

Some aspects of the present disclosure also provide a method for manufacturing a semiconductor device using an atomic layer deposition device that is capable of dividing a reaction space to deposit various types of thin films.

According to an example embodiment, According to an example embodiment, a device for manufacturing a semiconductor device includes a tube extending in a first direction, the tube defining a reaction space therein and configured to accommodate a boat that is configured to receive a plurality of substrates therein, and first and second nozzles each extending in the first direction inside the tube, the first and second nozzles being apart from each other on a horizontal plane that is perpendicular to the first direction and parallel to upper surfaces of the substrates, wherein the first nozzle includes a plurality of first injection ports and the second nozzle includes a plurality of second injection ports, the plurality of first injection ports and the plurality of second injection ports configured to inject a first gas and a second gas toward a center of the reaction space, respectively, and the plurality of second injection ports are in a region between a corresponding pair of adjacent ones of the plurality of first injection ports in the first direction.

According to an example embodiment, a device for manufacturing a semiconductor device includes a tube extending in a first direction, the tube including a reaction space therein and configured to accommodate a boat that is configured to receive a plurality of substrates therein, and first and second nozzles each extending in the first direction inside the tube, the first and second nozzles being apart from each other on a horizontal plane perpendicular to the first direction and parallel to upper surfaces of the substrates, wherein the first nozzle includes a plurality of first injection ports that are configured to inject a plurality of first gas layers to divide the reaction space into a plurality of regions along the first direction, and the second nozzle includes a second injection port that is configured to inject a second gas layer into a region between a corresponding adjacent pair of the plurality of first gas layers.

According to an example embodiment, a device for manufacturing a semiconductor device using a device for manufacturing the semiconductor device includes a first tube configured to receive a substrate therein, the first tube extending in a first direction perpendicular to an upper surface of the substrate, a second tube in the first tube, the second tube defining a reaction space therein and configured to a boat that is configured to support a plurality of substrates thereon, and first to third nozzles extending in the second tube along the first direction, the first to third nozzles being apart from each other on a plane parallel to the upper surface of the substrate, wherein the first nozzle is configured to inject a plurality of first gas layers to define a plurality of regions in the first direction, and the second and third nozzles are configured to inject second and third gas layers into different regions among the plurality of regions, respectively.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other example embodiments and features of the present disclosure will become more apparent by describing in detail some example embodiments thereof with reference to the attached drawings, in which:

FIG. 8 is a diagram in which the device for manufacturing the semiconductor device according to an example embodiment is viewed from the top;

DETAILED DESCRIPTION

While the term "same" is used in description of example embodiments, it should be understood that some imprecisions may exist. Thus, when one element is referred to as being the same as another element, it should be understood that the one element is the same as another element within a desired manufacturing tolerance range (e.g., ±10%).

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
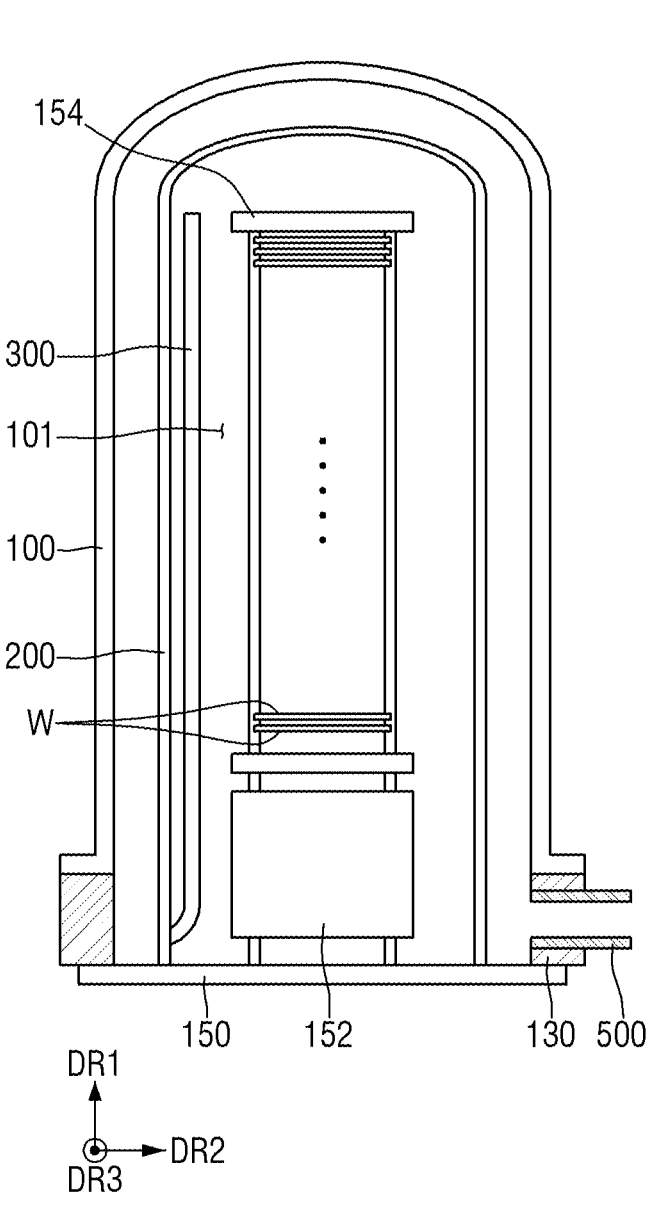
FIG. 1 is a diagram which shows schematically a device for manufacturing a semiconductor device according to an example embodiment.
Figure 2:
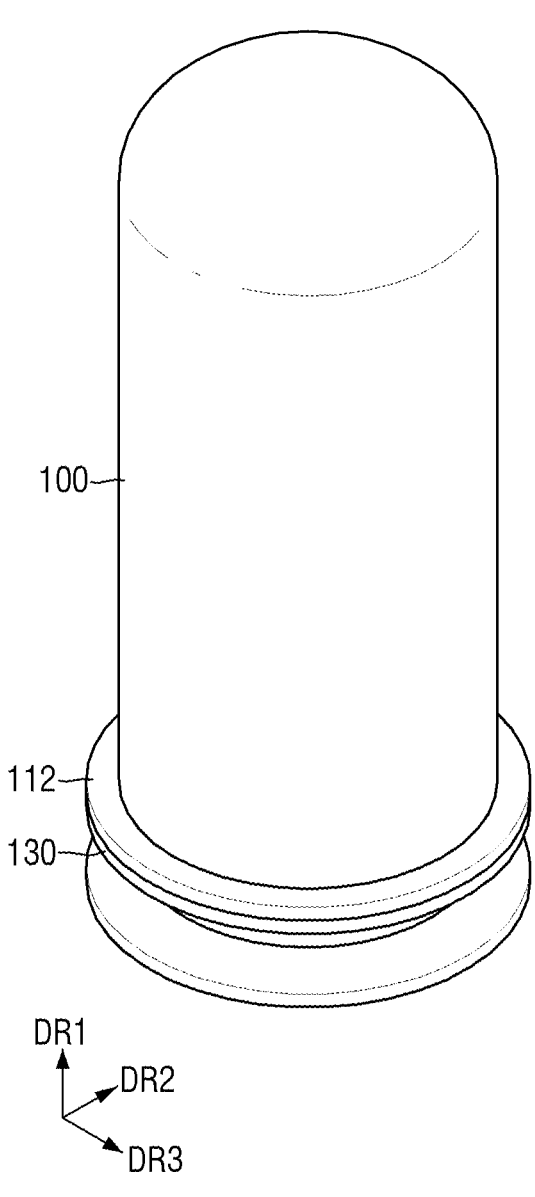
FIG. 2 is a diagram which shows a first tube of the device for manufacturing the semiconductor device according to an example embodiment.
Figure 3:
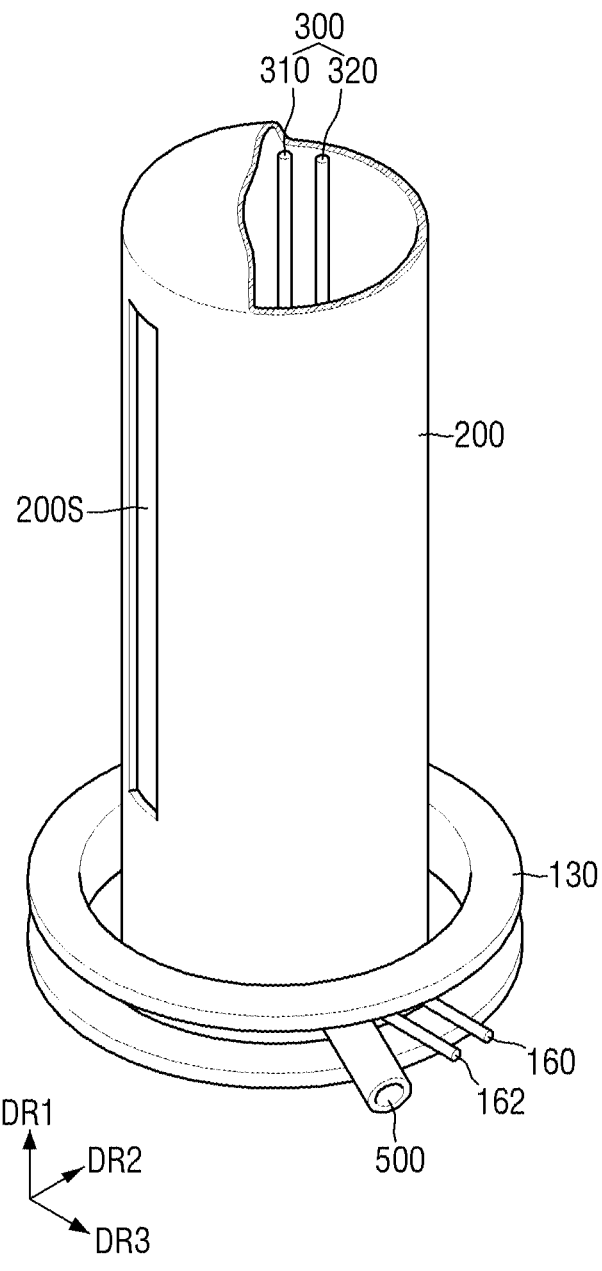
FIG. 3 is a diagram which shows a second tube of the device for manufacturing the semiconductor device according to an example embodiment.
Figure 5:
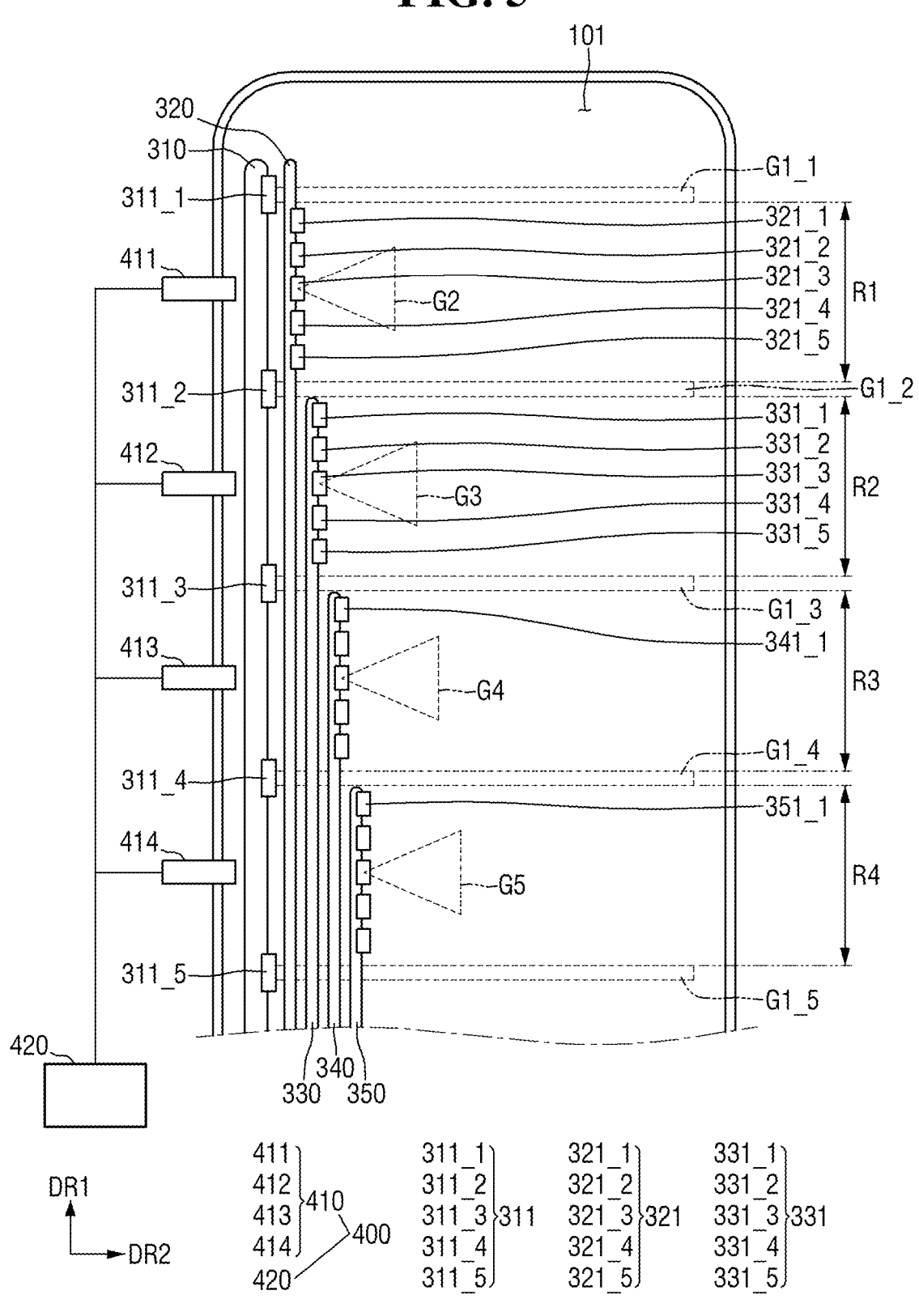
FIG. 5 is a diagram for explaining a nozzle unit and a temperature control unit of the device for manufacturing the semiconductor device according to an example embodiment.

FIG. 1 is a diagram which shows schematically a device for manufacturing a semiconductor device according to an example embodiment. FIG. 2 is a diagram which shows a first tube of the device for manufacturing the semiconductor device according to an example embodiment. FIG. 3 is a diagram which shows a second tube of the device for manufacturing the semiconductor device according to an example embodiment. FIG. 5 is a diagram for explaining a nozzle unit and a temperature control unit of the device for manufacturing the semiconductor device according to an example embodiment.

Referring to FIG. 1, a device 1000 for manufacturing the semiconductor device according to an example embodiment may include a first tube 100, a second tube 200, a nozzle unit 300, and an exhaust unit 500.

The device 1000 for manufacturing the semiconductor device according to an example embodiment may be an apparatus that performs a process of supplying a process gas onto a substrate W such as a wafer to manufacture a semiconductor device. The device 1000 for manufacturing the semiconductor device according to an example embodiment may be, for example, an atomic layer deposition device (ALD). The device 1000 for manufacturing the semiconductor device according to an example embodiment may be various deposition devices for depositing a thin film on the substrate W, using a reaction gas or a precursor. The device 1000 for manufacturing the semiconductor device according to an example embodiment is not limited thereto, and may be used for etching, deposition, ashing, and/or annealing processes using the process gas. The device 1000 for manufacturing the semiconductor device according to an example embodiment may be a batch type apparatus in which a vapor deposition process is simultaneously performed on a plurality of substrates W.

In an example embodiment, a first direction DR1 may mean a vertical direction, and a second direction DR2 may mean a direction that is parallel to an upper surface of the substrate W and perpendicular to the first direction DR1. Further, a third direction DR3 may mean a direction that is parallel to the upper surface of the substrate W and intersects each of the first direction DR1 and the second direction DR2.

The first tube 100 may provide an internal space that performs the manufacturing process of the semiconductor device on the substrate W. The first tube 100 may be made of a material that may withstand even a high temperature, for example, quartz or silicon carbide (SiC). Although not specifically shown, the device 1000 for manufacturing the semiconductor device according to an example embodiment may further include a heating unit for wrapping the first tube 100 and heating the first tube 100.

For example, a lower end portion of the first tube 100 may be an open end portion, and an upper end portion of the first tube 100 may be a closed end portion. The lower end portion of the first tube 100 may have a flange 112 that protrudes in an outward direction, and the flange 112 may be mounted on the support 130. For example, the flange 112 of the first tube 100 may be connected to the support 130 by a sealing member such as an O-ring to seal the first tube 100. Therefore, the first tube 100 may extend from the support 130 in the first direction DR1. In this example embodiments, the first tube 100 having a cylinder shape, which has a circular cross-section, is illustrated. However, the technical idea of the present disclosure is not limited thereto. In some example embodiments, the first tube 100 may have a rectangular cross-section, a pentagonal cross-section, or an octagonal cross-section.

According to an example embodiment, the device 1000 for manufacturing the semiconductor device may include a vertical batch reactor. The second tube 200 is placed in the first tube 100 and may define a reaction space 101 extending in the first direction DR1.

The second tube 200 may be an inner tube placed inside the first tube 100. The lower end portion of the second tube 200 may be an open end portion, and the upper end portion of the second tube 200 may be a closed end portion. However, the technical idea of the present disclosure is not limited thereto, and the second tube 200 may have a cylinder shape in which the upper end portion and the lower end portion are open. The second tube 100 may have a cylinder shape, which has a circular cross-section. However, the technical idea of the present disclosure is not limited thereto. In some example embodiments, the second tube 200 may have a rectangular cross-section, a pentagonal cross-section, or an octagonal cross-section.

Referring to FIG. 3, an exhaust slit 200S of the second tube 200 may be formed in the form extending in the first direction DR1. However, as will be described later, the shape of the exhaust slit 200S of some example embodiments may be formed in various forms. That is, the shape of the exhaust slit 200S may not be limited to the form shown in FIG. 3, as long as it has a form for smoothly exhausting the gas inside the reaction space 101 and smoothly injecting the first gas layer G1 from the first nozzle 310.

The reaction space 101 may be a space in which a boat 154 for accommodating the substrate W is placed. The boat 154 may be placed inside the second tube 200. The boat 154 may accommodate a plurality of substrates W separated in the first direction DR1. The boat 154 may be placed on the stage 152 supported on a door plate 150.

The nozzle unit 300 may be placed inside the first tube 100 and the second tube 200. The nozzle unit 300 may include first to fifth nozzles 310, 320, 330, 340 and 350 that each extend in the first direction DR1 inside the second tube 200, and are placed apart from each other in the second direction DR2 or the third direction DR3 parallel to the upper surface of the substrate W.

In some example embodiments, although the number of nozzles included in the nozzle unit 300 is shown as five, the technical idea of the present disclosure is not limited thereto. That is, the number of nozzles may be formed by a plurality of nozzles other than five depending on the vapor deposition process.

The first and second nozzles 310 and 320 may include a plurality of first and second injection ports 311 and 321 that inject different gases, respectively, toward the reaction space 101 (e.g., toward a center of the reaction space 101).

A first injection port 311 may divide the reaction space 101 into a plurality of regions R1, R2, R3, and R4 on the basis of the first direction DR1. Specifically, the first injection port 311 may inject the first gas layer G1 to define the reaction space 101 into a plurality of regions R1, R2, R3, and R4 along the first direction DR1. In some example embodiments, the plurality of regions R1, R2, R3, and R4 of the reaction space 101 may mean regions in which the vapor deposition process may be performed on the substrate W.

In FIG. 5, although the plurality of regions are shown as four regions R1, R2, R3, and R4, the technical idea of the present disclosure is not limited thereto. That is, the regions that partition the reaction space 101 may be partitioned into a plurality of regions other than four. Further, the heights of the regions that partition the reaction space 101 along the first direction DR1 may also be different from each other.

The first injection port 311 may include a first_1 injection port 311_1 and a first_2 injection port 311_2 separated from each other in the first direction DR1. The first_1 injection port 3111 and the first_2 injection port 3112 may form a first_1 gas layer G1_1 and a first_2 gas layer G1_2, respectively, and the first_1 gas layer G1_1 and the first_2 gas layer G1_2 may define the first region R1 therebetween.

The first injection port 311 may further include a first_3 injection port 311_3 which is separated from the first_2 injection port 311_2 in the first direction DR1 and forms a first_3 gas layer G1_3 that defines the second region R2 in conjunction with the first_2 gas layer G1_2. In other words, the first_3 gas layer G1_3 and the first_2 gas layer G1_2 define the second region R2 therebetween. The first injection port 311 may further include a first_4 injection port 311_4 which is separated from the first_3 injection port 311_3 in the first direction DR1 and forms a first_4 gas layer G1_4 that defines the third region R3 in conjunction with the first_3 gas layer G1_3. In other words, the first_4 gas layer G1_4 and the first_3 gas layer G1_3 define the third region R3 therebetween. The first injection port 311 may further include a first_5 injection port 311_5 which is separated from the first_4 injection port 311_4 in the first direction DR1 and forms a first_5 gas layer G1_5 that defines the fourth region R4 in conjunction with the first_4 gas layer G1_4. In other words, the first_5 gas layer G1_5 and the first_4 gas layer G1_4 define the third region R3 therebetween.

The first gas layer G1 may include an inert gas. The first gas layer G1 may include, for example, at least one selected from Ar, $N_2$, Xe, and He.

The second gas layer G2 may be injected into the first region R1 by the second injection port 321. The second injection port 321 may include second_1 to second_5 injection ports 3211, 321_2, 3213, 3214, and 3215, each of which forms the second gas layer G2 inside the first region R1.

The second injection port 321 may be placed in the region between the plurality of first injection ports 311 along the first direction DR1. In this case, an interval between the first_1 injection port 311_1 and the first_2 injection port 311_2 may be greater than an interval between the second_1 and second_2 injection ports 321_1 and 321_2.

The nozzle unit 300 may further include a third nozzle 330 that extends in the first direction DR1 and is placed apart from the first and second nozzles 310 and 320 in the second direction DR2. The third nozzle 330 may include a plurality of third injection ports 331 that inject a gas different from the first nozzle 310 toward the reaction space 101 (e.g., toward the center of the reaction space 101).

A third gas layer G3 may be injected into the second region R2 by the third injection port 331. The third injection port 331 may include third_1 to third_5 injection ports 3311, 3312, 3313, 3314, and 3315, each of which forms the third gas layer G3 to define the second region R2 spaced from the first region R1 in the first direction DR1.

The third injection port 331 may be placed in the region between the plurality of first injection ports 311 along the first direction DR1. In this case, the interval between the first_2 injection port 311_2 and the first_3 injection port 3113 may be greater than the interval between the third_1 and the third_2 injection ports 331_1 and 331_2.

The nozzle unit 300 may further include a fourth nozzle 340 that extends in the first direction DR1 and is placed apart from the first to third nozzles 310, 320, and 330 in the second direction DR2 or in the third direction DR3 parallel to the upper surface of the substrate W. A fourth gas layer G4 may be injected into the third region R3 by a fourth injection port 341_1 of the fourth nozzle 340.

The nozzle unit 300 may further include a fifth nozzle 350 that extends in the first direction DR1 and is placed apart from the first to fourth nozzles 310, 320, 330, and 340 in the second direction DR2 or in the third direction DR3 parallel to the upper surface of the substrate W. A fifth gas layer G5 may be injected into the fourth region R4 by a fifth injection port 351_1 of the fifth nozzle 350.

The above-mentioned description regarding the second and third nozzles 320 and 330 may be applied to the fourth and fifth nozzles 340 and 350 in the same manner.

In some example embodiments, although the number of injection ports of each of the second to fifth nozzles 320, 330, 340, and 350 is shown as five, the technical idea of the present disclosure is not limited thereto. That is, the number of injection ports of each of the second to fifth nozzles 320, 330, 340, and 350 may be variously formed depending on the vapor deposition process.

Referring to FIG. 5, the length of the third nozzle 330 extending in the first direction DR1 may be shorter than the length of the second nozzle 320 extending in the first direction DR1. Further, the length of the fourth nozzle 340 extending in the first direction DR1 may be shorter than the length of the third nozzle 330 extending in the first direction DR1. Further, the length of the fifth nozzle 350 extending in the first direction DR1 may be shorter than the length of the fourth nozzle 340 extending in the first direction DR1.

However, the technical idea of the present disclosure is not limited thereto. That is, the lengths of the second to fifth nozzles 320, 330, 340, and 350 along the first direction DR1 may not have a shape that gradually decreases as shown in FIG. 5. The length of the second to fifth nozzles 320, 330, 340, and 350 along the first direction DR1 may be not limited as long as the desired vapor deposition process is smoothly performed.

The second to fifth gas layers G2, G3, G4, and G5 may include a reaction gas or a precursor for forming an oxide film or a nitride film. The substance included in the second to fifth gas layers G2, G3, G4, and G5 may include a substance for depositing a different kinds of thin films on the substrate W. In this case, the second to fifth gas layers G2, G3, G4, and G5 including different substances, respectively, may be injected into the first to fourth regions R1, R2, R3, and R4, respectively.

On the other hand, the technical idea of the present disclosure is not limited thereto. For example, the second and fourth gas layers G2 and G4 including the same substance may be injected into the first and third regions R1 and R3, respectively, and the third and fifth gas layers G3 and G5 including the substance different from the second and fourth gas layers G2 and G4 may be injected into the second and fourth regions R2 and R4, respectively. That is, the types of substances of the second to fifth gas layers G2, G3, G4, and G5 may be used in various ways depending on the vapor deposition process.

According to some example embodiments, the first gas layer G1 may block the second to fifth gas layers G2, G3, G4, and G5 including the reaction gas or the precursor gas from each other by a curtain effect. That is, by reliably dividing the reaction space in the vapor deposition device using the first gas layer G1 (e.g., using a plurality of first gas layers G1_1, G1_2, G1_3, G1_4, and G1_5) including the inert gas, the chemical reaction for depositing the different substances may be performed more smoothly.

Figure 4:
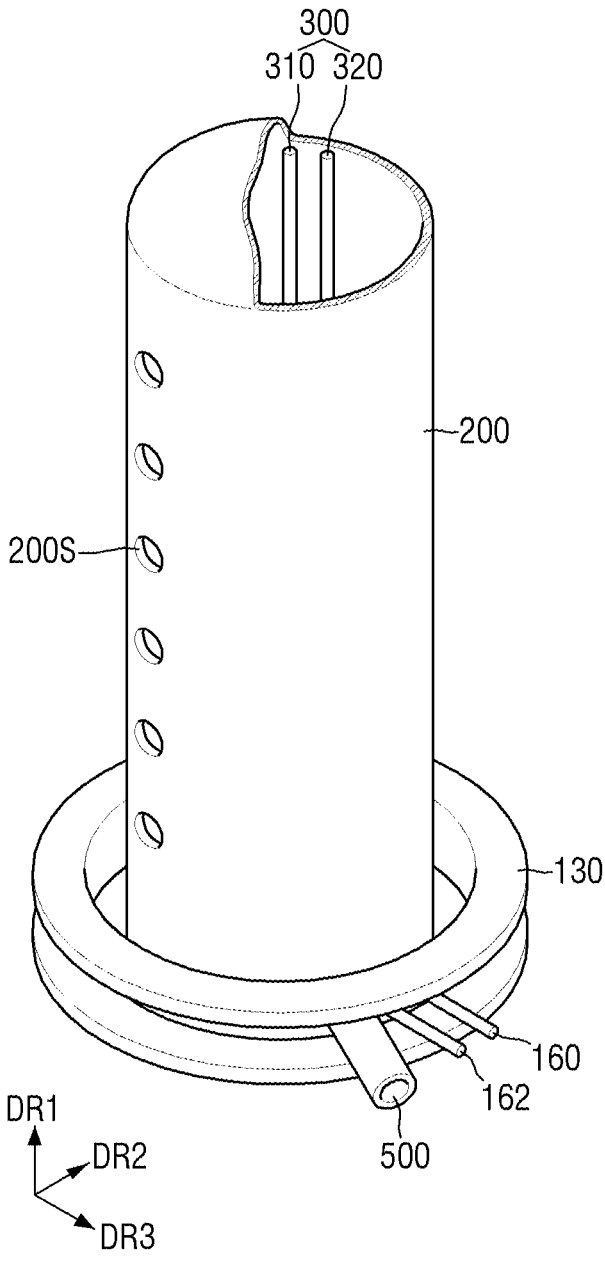
FIG. 4 is a diagram which shows the second tube of the device for manufacturing the semiconductor device according to an example embodiment.

FIG. 4 is a diagram which shows the second tube of the device for manufacturing the semiconductor device according to an example embodiment. For convenience of explanation, the same or repeated parts of contents explained using FIGS. 1 to 3 will be omitted or briefly explained The exhaust slit 200S of the second tube 200 may be formed by a plurality of exhaust slits 200S separated from each other. Also in this case, as will be described later, the exhaust slit 200S and the first nozzle 310 may be formed so as not to correspond to each other. The shape of the exhaust slit 200S may not be limited to the form shown in FIG. 4, as long as the gas inside the reaction space 101 is smoothly exhausted and the first gas layer G1 is smoothly injected from the first nozzle 310.

Figure 6:
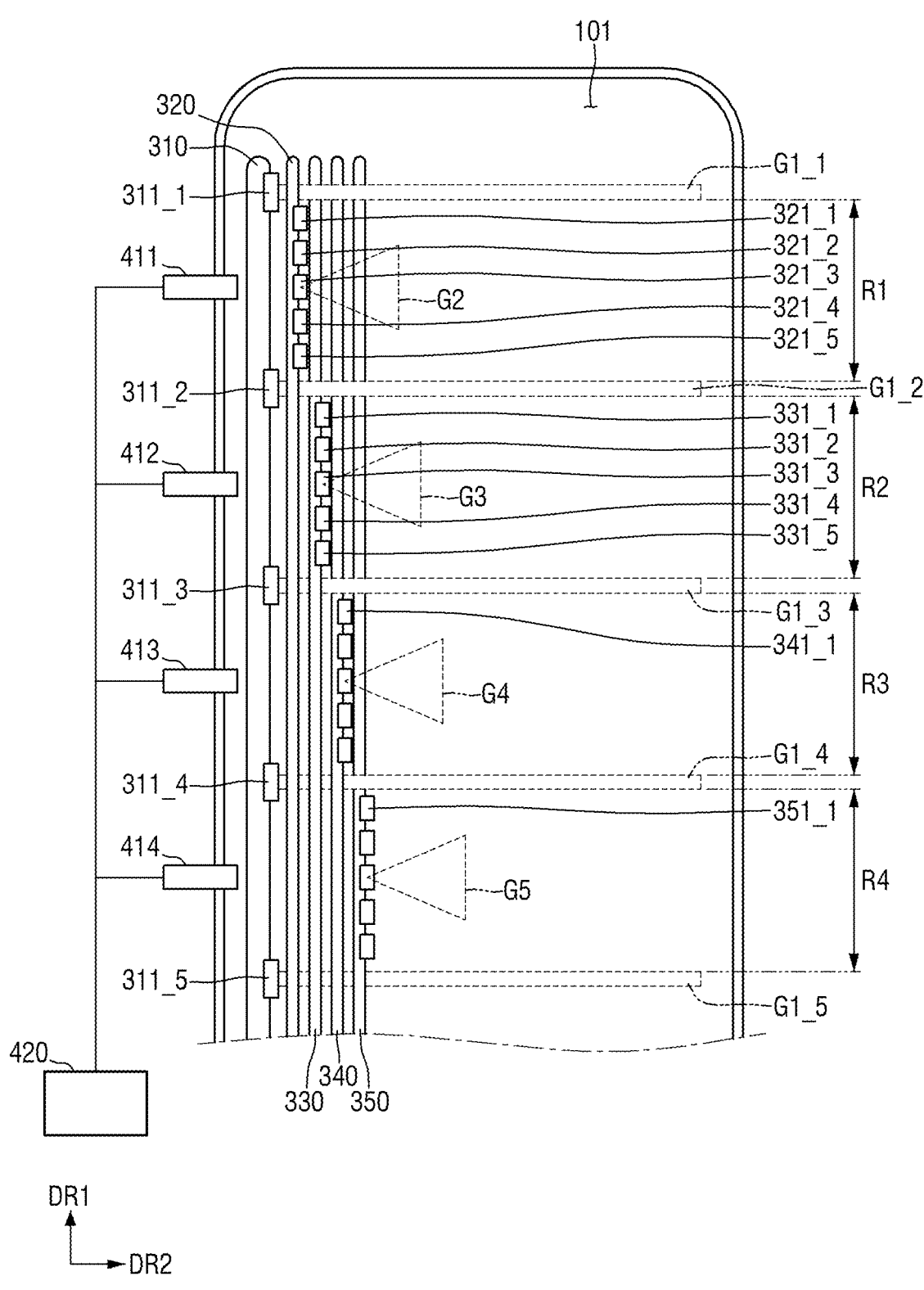
FIG. 6 is a diagram for explaining the nozzle unit of the device for manufacturing the semiconductor device according to an example embodiment.

FIG. 6 is a diagram for explaining the nozzle unit of the device for manufacturing the semiconductor device according to an example embodiment. For convenience of explanation, the same or repeated parts of contents explained using FIGS. 1 to 5 will be omitted or briefly explained Referring to FIG. 6, the length of the first nozzle 310 extending in the first direction DR1 may be the same as the length of the second to fifth nozzles 320, 330, 340, and 350 extending in the first direction DR1. Further, the lengths of the second to fifth nozzles 320, 330, 340, and 350 extending in the first direction DR1 may be equal to each other.

In this case, the heights of the second to fifth nozzles 320, 330, 340, and 350 are the same, but the positions of the injection ports may be different from each other on the basis of the first direction DR1. For example, the positions of the plurality of third injection ports 331 of the third nozzle 330 may be placed below the positions of the plurality of second injection ports 321 of the second nozzle 320 in the first direction DR1. That is, the region in the reaction space 101 may be divided by making the height of the injection port different for each nozzle, while placing the heights of the nozzles to be the same.

A temperature sensing unit (or alternatively, temperature sensor) 400 may include a plurality of temperature sensing units 411, 421, 413, and 414 which sense the temperatures of each of the plurality of regions R1, R2, R3, and R4, and a temperature control unit (or alternatively, temperature controller) 420 which controls the temperatures of the plurality of regions R1, R2, R3, and R4. The temperature control unit 420 may independently control the temperatures of each of the regions R1, R2, R3, and R4. The temperature control unit 420 may be implemented in processing circuitry such as hardware including logic circuits, a hardware/software combination such as a processor executing software, or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The exhaust unit 500 may exhaust the gas in the reaction space 101 to the outside from the exhaust slit 200S formed in the second tube 200. The exhaust unit 500 may extend along the second direction DR2. The gas in the reaction space 101 may be discharged to the outside of the reaction space 101 through the exhaust unit 500.

Figure 7A:
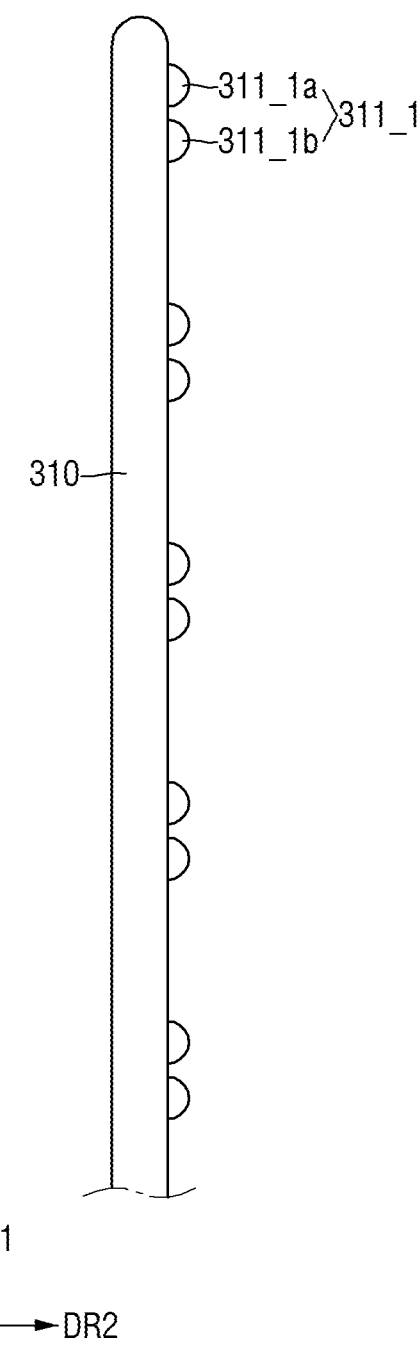
FIG. 7a is a diagram in which a first nozzle of the device for manufacturing the semiconductor device according to an example embodiment is viewed from the side part.
Figure 7B:
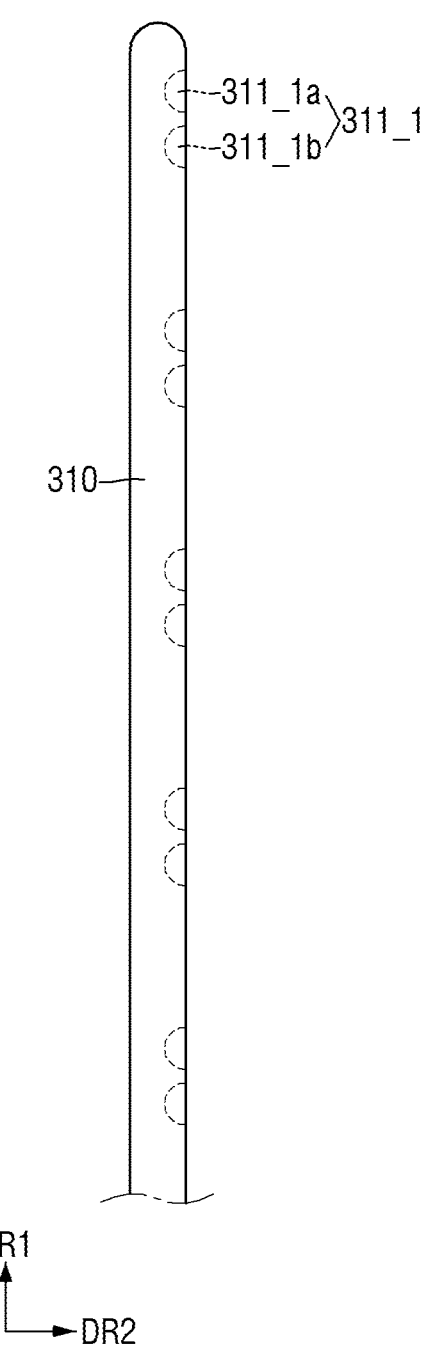
FIG. 7b is a diagram in which the first nozzle of the device for manufacturing the semiconductor device according to an example embodiment is viewed from the side part.
Figure 7C:
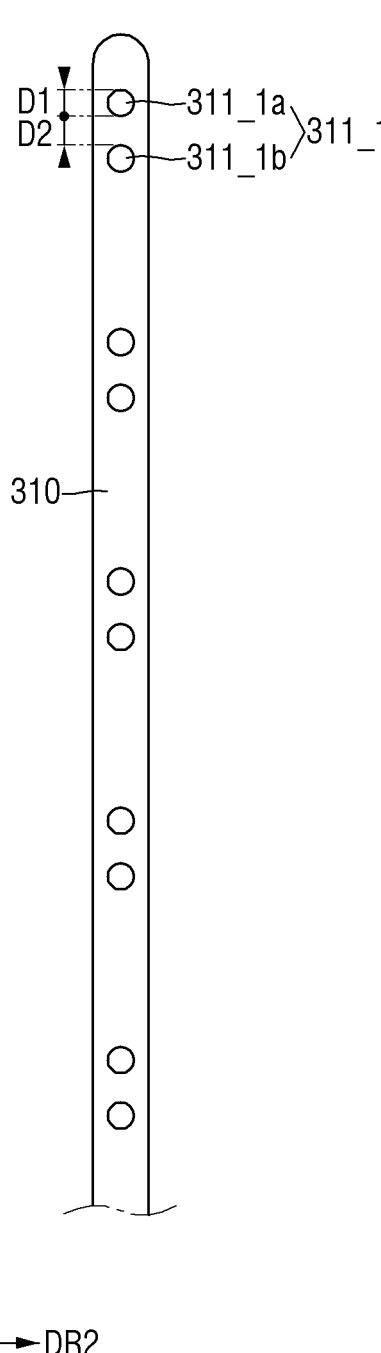
FIG. 7c is a diagram in which the first nozzle of the device for manufacturing the semiconductor device according to an example embodiment is viewed from the front part.

FIG. 7a is a diagram in which a first nozzle of the device for manufacturing the semiconductor device according to an example embodiment is viewed from the side part. FIG. 7(b) is a diagram in which the first nozzle of the device for manufacturing the semiconductor device according to an example embodiment is viewed from the side part. FIG. 7(c) is a diagram in which the first nozzle of the device for manufacturing the semiconductor device according to an example embodiment is viewed from the front part.

Referring to FIGS. 7a to 7c, a plurality of first_1 injection ports 311_1 of the first nozzle 310 may be formed.

Referring to FIG. 7a, the first_1 injection port 311_1 may include a first protruding injection port (or alternatively, first injection sub-port) 311_1a and a second protruding injection port (or alternatively, second injection sub-port) 311_1b protruding in the second direction DR2.

Similarly, the first_2 to first_5 injection ports 311_2, 311_3, 311_4, and 311_5 of FIG. 5 may also be formed in a protruding form.

In this case, the first gas layer G1 ejected from the first nozzle 310 may be formed at a higher density in the directions DR2 and DR3 parallel to the upper surface of the substrate W.

Therefore, the region in the reaction space 101 may be divided more reliably.

Alternatively, referring to FIG. 7b, the first injection port 311 may have a shape that is concavely recessed in the second direction DR2. That is, the first injection port 311 for injecting the first gas layer G1 may have a hole shape.

Similarly, the first_2 to first_5 injection ports 311_2, 3113, 311_4 and 311_5 of FIG. 5 may also be formed in the hole shape.

Referring to FIG. 7c, a diameter D1 of the first protruding injection port 311_1a (or the second protruding injection port 311_1b) may be 0.5 mm to 1.2 mm. Further, an interval D2 between the first and second protruding injection ports 311_1a to 311_1b may be 5 mm to 10 mm.

Although not specifically shown, the size of the diameter of each of the plurality of first injection ports 311 may be smaller than the size of the diameter of the second injection port 321. In this case, the first gas layer G1 ejected from the first nozzle 310 may be formed at a higher density in the directions DR2 and DR3 parallel to the upper surface of the substrate W. Therefore, the region in the reaction space 101 may be divided more reliably.

The same description may be applied to the first_2 to first_5 injection ports 3112, 3113, 311_4 and 311_5 of FIG. 5.

Figure 8:
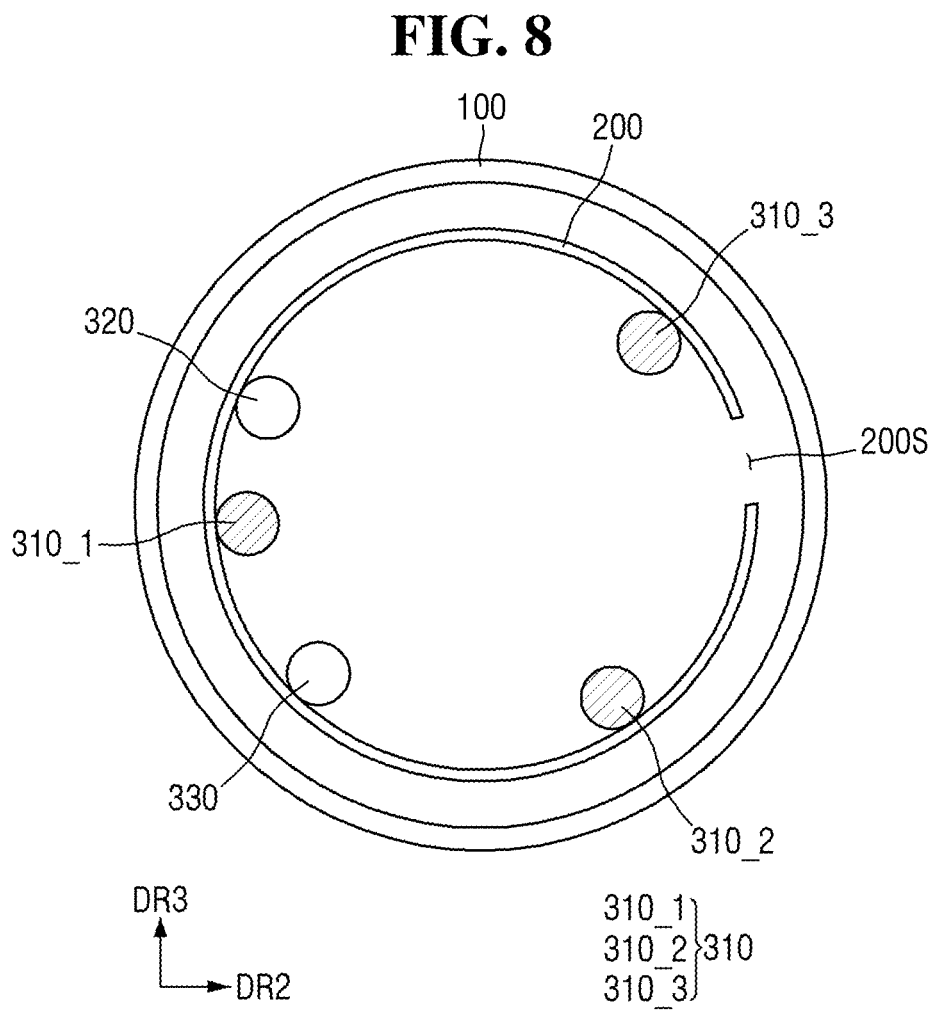
Figure 9:
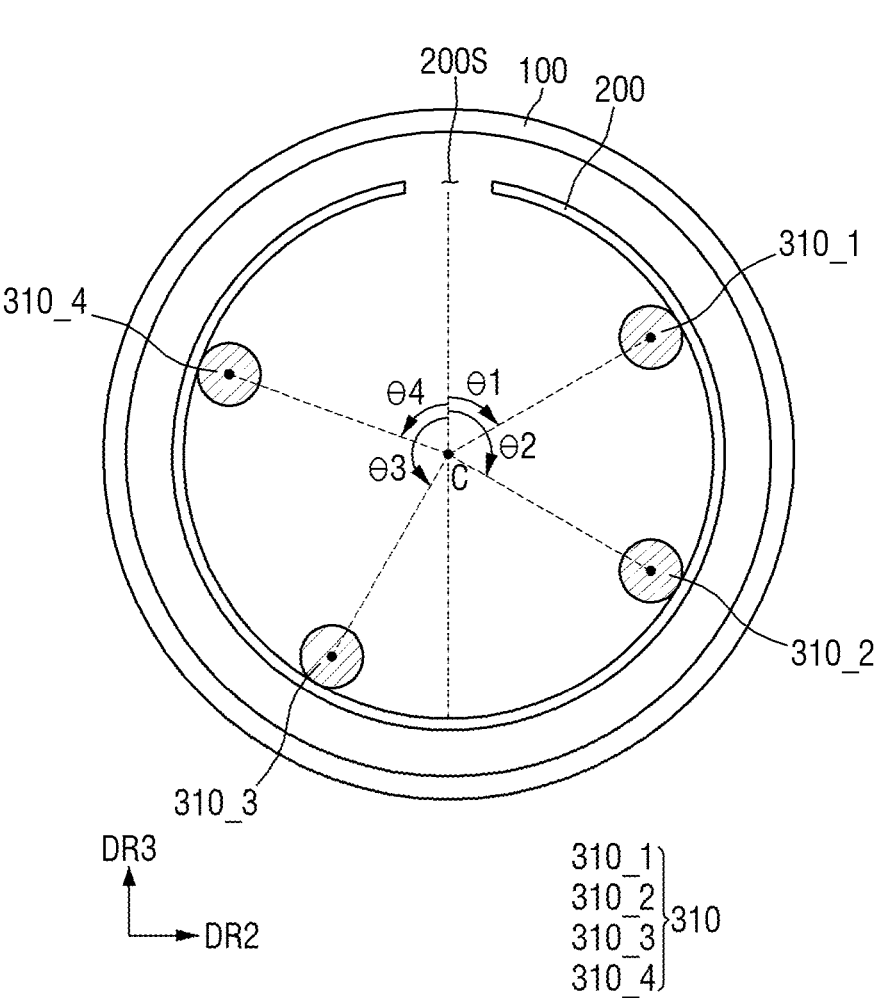
FIG. 9 is a diagram in which the device for manufacturing the semiconductor device according to an example embodiment is viewed from the top.

FIG. 8 is a diagram in which the device for manufacturing the semiconductor device according to an example embodiment is viewed from the top. FIG. 9 is a diagram in which the device for manufacturing the semiconductor device according to an example embodiment is viewed from the top.

Referring to FIG. 8, a plurality of first nozzles 310 are placed, and the second and third nozzles 320 and 330 may be placed between the first nozzles 310.

For example, the first nozzle 310 may include a plurality of first nozzles (e.g., first_1 nozzle 310_1, first_2 nozzle 310_2 and first_3 nozzle 310_3) that are separated from each other in the second direction DR2 or the third direction DR3 on a plane parallel to the upper surface of the substrate W. Further, each of the second nozzle 320 and the third nozzle 330 may be placed between a corresponding pair from among the plurality of first nozzles (e.g., first_1 nozzle 310_1, first_2 nozzle 310_2, and first_3 nozzle 3103).

Although the number of first nozzles 310 is shown as three, the technical idea of the present disclosure is not limited thereto. In some example embodiments, the number of first nozzles 310 may be five or more. That is, the number of the first nozzles 310 may be variously formed depending on the vapor deposition process.

Referring to FIG. 9, the exhaust slit 200S and the first injection port 311 of the first nozzle 310 may not correspond to each other. This makes it possible to mitigate or prevent the inert gas of the first injection port 311 from easily escaping by the exhaust slit 200S.

For example, the first nozzle 310 may include a plurality of first nozzles (e.g., first_1 nozzle 310_1, first_2 nozzle 310_2, first_3 nozzle 3103, and first_4 nozzle 310_4) that are spaced apart from each other in the second direction DR2 or the third direction DR3 on a plane parallel to the upper surface of the substrate W.

On a straight line passing through the center C of the second tube 200 on the basis of the position of the exhaust slit 200S (e.g., with respect to a straight line connection the center C of the second tube 200 and a horizontal center of the exhaust slit on the plane parallel to the upper surface of the substrate W), the first_1 nozzle 310_1 is placed at a position rotated by a first angle θ1 in a clockwise direction, the first_2 nozzle 310_2 is placed at a position rotated by a second angle θ2 in the clockwise direction, the first_3 nozzle 310_3 is placed at a position rotated by a third angle θ3 in a counterclockwise direction, and the first_4 nozzle 3104 may be placed at a position rotated by a fourth angle θ4 in the counterclockwise direction.

For example, the first angle θ1 may be 60 degrees, the second angle θ2 may be 120 degrees, the third angle θ3 may be 150 degrees, and the fourth angle θ4 may be 60 degrees. However, the technical idea of the present disclosure is not limited thereto. A positional relationship between the exhaust slits 200S and the plurality of first nozzles 310 may not be limited to the form shown in FIG. 9, as long as the gas in the reaction space 101 is smoothly exhausted, and the first gas layer G1 is smoothly injected from the first nozzle 310.

Further, according to some example embodiments, the first injection port 311 may be placed at various positions within a range in which the exhaust slit 200S and the first injection port 311 do not correspond to each other.

In concluding the detailed description, those skilled in the art will appreciate that many variations and modifications may be made to the disclosed example embodiments without substantially departing from the principles of the present disclosure. Therefore, the disclosed example embodiments of the inventive concepts are used in a generic and descriptive sense only and not for purposes of limitation.

What is claimed is:

1. A device for manufacturing a semiconductor device comprising:

a tube extending in a first direction, the tube defining a reaction space therein and configured to accommodate a boat that is configured to receive a plurality of substrates therein; and first and second nozzles each extending in the first direction inside the tube, the first and second nozzles being apart from each other on a horizontal plane that is perpendicular to the first direction and parallel to upper surfaces of the plurality of substrates, wherein the first nozzle includes a plurality of first injection ports and the second nozzle includes a plurality of second injection ports, the plurality of first injection ports and the plurality of second injection ports configured to inject a first gas and a second gas different from the first gas toward a center of the reaction space, respectively, and wherein the reaction space includes a plurality of regions along the first direction, and the plurality of second injection ports are in a first region, among the plurality of regions, between two adjacent first injection ports of the plurality of first injection ports.

2. The device for manufacturing the semiconductor device of claim 1, wherein the plurality of first injection ports include a first_1 injection port and a first_2 injection port adjacent to the first_1 injection port, the first_1 injection port and the first_2 injection port being apart from each other in the first direction to form the first region therebetween in the reaction space, and the plurality of second injection ports include a second_1 injection port and a second_2 injection port adjacent to the second_1 injection port, the second_1 injection port and the second_2 injection port being apart from each other in the first direction, and the second_1 injection port and the second_2 injection port being between the first_1 injection port and the first_2 injection port.

3. The device for manufacturing the semiconductor device of claim 2, wherein the first_1 injection port includes a first injection sub-port and a second injection sub-port, and an interval between the first injection sub-port and the second injection sub-port is 5 mm to 10 mm.

4. The device for manufacturing the semiconductor device of claim 1, wherein an interval between an adjacent pair of the plurality of first injection ports is greater than an interval between an adjacent pair of the plurality of second injection ports.

5. The device for manufacturing the semiconductor device of claim 1, wherein a size of a diameter of each of the plurality of first injection ports is smaller than a size of a diameter of each of the plurality of second injection ports.

6. The device for manufacturing the semiconductor device of claim 1, wherein the plurality of first injection ports protrude to be parallel to the upper surfaces of the plurality of substrates.

7. The device for manufacturing the semiconductor device of claim 2, further comprising:

a third nozzle extending in the first direction, the third nozzle being apart from the first and second nozzles on the horizontal plane, wherein the third nozzle includes a plurality of third injection ports configured to inject a third gas that is different from the first gas toward the center of the reaction space.

8. The device for manufacturing the semiconductor device of claim 7, wherein the plurality of first injection ports further include a first_3 injection port, the first_3 injection port and the first_2 injection port defining a second region therebetween, the second region being apart from the first region in the first direction, and the plurality of third injection ports include a third_1 injection port and a third_2 injection port adjacent to the third_1 injection port inside the second region.

9. The device for manufacturing the semiconductor device of claim 7, wherein a length of the third nozzle extending in the first direction is different from a length of the second nozzle extending in the first direction.

10. The device for manufacturing the semiconductor device of claim 1, wherein the plurality of first injection ports are configured to inject an inert gas, and the plurality of second injection ports are configured to inject a reaction gas.

11. The device for manufacturing the semiconductor device of claim 1, further comprising:

a plurality of temperature sensors, each of the plurality of temperature sensors configured to sense temperatures of regions defined by a corresponding one of respective pairs of the plurality of first injection ports; and a temperature controller configured to control the temperatures of the regions between the plurality of first injection ports, wherein the temperature controller is configured to individually control the temperatures of the regions.

12. The device for manufacturing the semiconductor device of claim 1, further comprising:

an exhaust configured to exhausts remaining gases in the reaction space to an outside through an exhaust slit defined in the tube, wherein the exhaust slit and the plurality of first injection ports do not correspond to each other.

\* \* \* \* \*